United States Patent [19]

King et al.

[11] Patent Number: 5,604,883
[45] Date of Patent: Feb. 18, 1997

[54] COMPUTER MEMORY OPEN PAGE BIAS METHOD AND SYSTEM

[75] Inventors: Edward C. King, Fremont, Calif.; Fulps V. Vermeer, Delft, Netherlands

[73] Assignee: NCR Corporation, Dayton, Ohio

[21] Appl. No.: 629,789

[22] Filed: Apr. 9, 1996

Related U.S. Application Data

[63] Continuation of Ser. No. 563,221, Aug. 6, 1990, abandoned.

[51] Int. Cl.$^6$ .................................................. G06F 12/06
[52] U.S. Cl. .................... 395/481; 395/431; 365/238.5
[58] Field of Search ............................... 395/484, 481, 395/431, 421.03, 421.04, 494; 365/238.5, 230.09, 230.03

[56] References Cited

U.S. PATENT DOCUMENTS

| | | | |
|---|---|---|---|
| 4,594,659 | 6/1986 | Guenthner et al. | 395/375 |
| 4,884,197 | 11/1989 | Sachs et al. | 395/450 |
| 4,888,679 | 12/1989 | Fossum et al. | 395/800 |
| 4,933,910 | 6/1990 | Olson et al. | 365/238.5 |
| 4,965,717 | 10/1990 | Cutts, Jr. et al. | 395/182.1 |
| 5,051,889 | 9/1991 | Fung et al. | 395/484 |

OTHER PUBLICATIONS

Patent Abstracts of Japan, vol. 7, No. 75 (p–187)(1220) 29 Mar. 1983 & JP-A-58 004 447 (Hitachi) Jan. 11, 1983 (Abstract).
IBM Technical Disclosure Bulletin, vol. 32, No. 6B, Nov. 1989, New York, NY, pp. 477–478 "Multiple Activity Page Memory".

*Primary Examiner*—Eddie P. Chan
*Assistant Examiner*—Kevin L. Ellis
*Attorney, Agent, or Firm*—Douglas S. Foote

[57] ABSTRACT

A method for accessing data in a computer memory divided into pages. A first page is opened in response to a first address to access data therein. A second page is opened in response to a second address to access data therein. The first page is then reopened prior to receiving another address signal.

16 Claims, 3 Drawing Sheets

COMPUTER MEMORY OPEN PAGE BIAS METHOD AND SYSTEM

This is a continuation of application Ser. No. 07/563,221, filed Aug. 6, 1990 now abandoned.

The present invention relates to computer memory systems. More particularly, it relates to a method and system for reducing access time to a DRAM system memory.

CROSS-REFERENCE TO RELATED APPLICATIONS

"Computer Memory System", U.S. patent application Ser. No. 07/563,216, filed concurrently herewith, still pending, invented by Edward C. King, Jackson L. Ellis, Robert B. Moussavi and Pirmin L. Weisser.

"Computer Memory System", U.S. patent application Ser. No. 07/563,214, filed concurrently herewith, now abandoned in favor of U.S patent application Ser. No. 08/132,421, still pending, invented by Edward C. King, Forrest O. Arnold, Jackson L. Ellis, Robert B. Moussavi, Pirmin L. Weisser and F. Vincentinus Vermeer.

"System and method for prefetching data from a main computer memory into a cache memory", U.S. Pat. No. 5,530,941, filed concurrently herewith, invented by Pirmin L. Weisser, F. Vincentinus Vermeer and Edward C. King.

"Method for reading a multiple byte data element in a memory system with at least one cache and a main memory", U.S. Pat. No. 5,420,994, filed concurrently herewith, invented by Edward C. King, Forrest O. Arnold, Jackson L. Ellis, Robert B. Moussavi, Pirmin L. Weisser, and F. Vincentinus Vermeer.

"Computer memory system and method for cleaning data elements ", U.S. Pat. No. 5,287,512, filed concurrently herewith, invented by Jackson L. Ellis.

"Method for serially or concurrently addressing n individually addressable memories each having an address latch and data latch", U.S. Pat. No. 5,434,990, filed concurrently herewith, invented by Robert B. Moussavi and Jackson L. Ellis.

"Computer Memory System and Method for Enhancing Performance on Cache Overflows", U.S. patent application Ser. No. 07/563,220, filed concurrently herewith, now abandoned in favor of U.S. patent application Ser. No. 08/415,789, now abandoned in favor of U.S. patent application Ser. No. 08/609,957, still pending, invented by Jackson L. Ellis, Robert B. Moussavi and Edward C. King.

REFERENCE TO A MICROFICHE APPENDIX

A microfiche appendix is provided herewith.

The appendix includes three microfiche having a combined total of 263 frames.

BACKGROUND OF THE INVENTION

The performance of a computer system can be enhanced by the use of a memory hierarchy. For example, a three tiered memory can be constructed from low, medium, and high speed memories. A low speed memory may be a magnetic disk for low cost, bulk storage of data. A medium speed memory may be constructed from DRAMs for use as the computer system's main memory. A high speed memory may employ SRAMs for use as a processor cache memory. The theory behind memory hierarchy is to group code (instructions) and other data to be executed by the system processor in the highest speed memory. Since high speed memory is typically the most expensive memory available, economics dictate that it be relatively small. Main memory consisting of DRAMs is denser and less expensive than a cache memory with SRAMs, and can therefore be significantly larger than the cache memory.

During operation, instructions and other data are transferred from system memory to the cache memory in order to have quick access to the variables of the currently executing program. As additional data, not in the cache, is required, such data is transferred from the main memory by replacing selected data in the cache. Various replacement algorithms are utilized to determine which data is replaced.

Irrespective of whether or not a cache memory is employed, increasing the response time of the DRAM memory can further improve system performance. There are several ways to increase the speed of a DRAM memory without changing the basic structure of the DRAM. For example, "interleaving" involves the creation of two banks of memory, with odd addresses in one bank and even addresses in the other. By this technique, one bank may be precharged while the other is being accessed. If a DRAM access normally takes two clock cycles, sequential accesses may be accomplished in one clock cycle each.

Another technique for speeding up DRAM access is referred to as "fast page mode". In a fast page mode, a DRAM controller activates a row line in a memory page and then strobes sequential column lines. Since the row line does not have to be precharged between accesses on the same page, the speed of reads and writes to the DRAM is increased. However, if sequential reads and writes are not to the same page, pages are continually being opened and closed and the fast page mode provides little or no performance advantage.

OBJECTS OF THE INVENTION

It is therefore an object of the present invention to provide a new and improved method for accessing data in a computer memory.

It is another object of the present invention to provide a high performance computer memory system.

It is a further object of the present invention to provide a system and method for reducing the access time for a DRAM system memory.

It is yet another object of the present invention to provide a system and method for automatically opening a memory page prior to receiving an address.

It is yet a further object of the present invention to provide a system and method for opening a memory page prior to receiving an address based on whether the page contains code or non-code data.

It is still another object of the present invention to provide a system and method enhancing the effectiveness of a fast page mode operation in a system memory.

SUMMARY OF THE INVENTION

The present invention is a method for improving the speed of accessing a computer system memory by opening predetermined pages in the memory prior to receiving an address. In effect an open page bias towards certain types of memory pages is established.

In one form the present invention is a method for accessing data in a computer memory divided into pages. A first page is opened in response to a first address to access data therein. A second page is opened in response to a second address to access data therein. The first page is then reopened prior to receiving another address signal.

In another form, the invention is a high performance computer memory system having a system memory for storing code and non-code data and including a plurality of first and second pages. The memory system comprises a register associated with the memory for holding the page address of the most recently accessed of the first pages. The page address is used to reopen the most recently accessed of the first pages after one of the second pages has been accessed.

In a narrower embodiment, the first pages hold either code or non-code data and the second pages hold either non-code or code data, respectfully.

DESCRIPTION OF A PREFERRED EMBODIMENT

Figure 1:
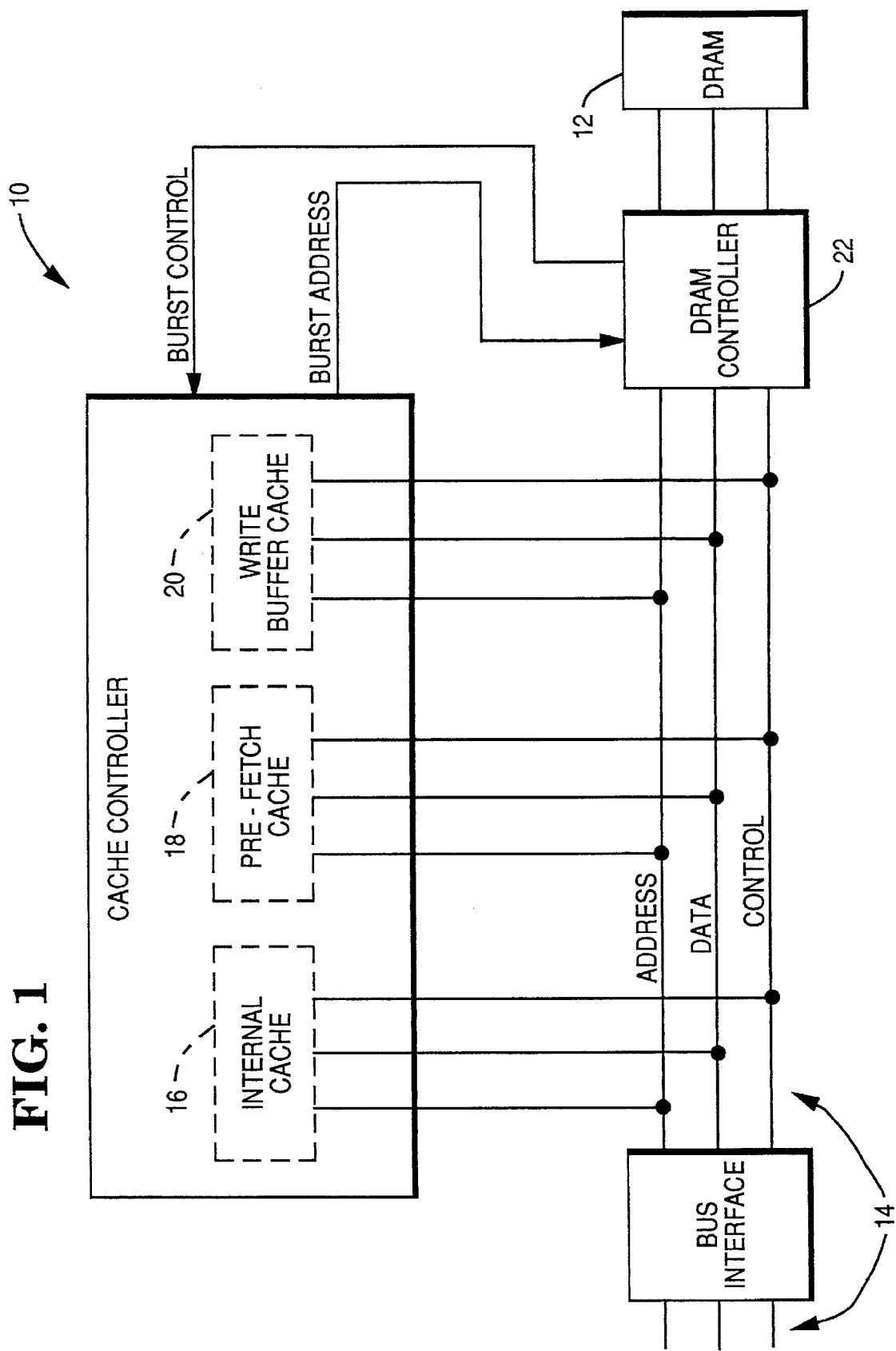
FIG. 1 is a block diagram of a high performance computer memory system.

FIG. 1 shows a block diagram of a computer memory system 10. System 10 includes a system memory 12 which in a preferred embodiment consists of dynamic random access memory (DRAM) chips. The data stored in memory 12 can be generally divided into code data (instructions) and non-code data. As used herein, the term "data" refers to information and includes both code data (instructions) and non-code data. Memory 12 is connected to other parts of a computer system (not shown) by a bus 14. Memory system 10 is designed for use with two or more bus masters, although it is operable with a single master. More particularly, it is designed for use with a host processor such as an Intel processor 386, 386sx or 486 in combination with other bus masters or devices which will compete with the host processor for access to memory system 10. Access to DRAM 12 is controlled by DRAM controller 22 which is located within bus 14.

Memory system 10 also includes an internal cache 16, a pre-fetch cache 18 and a write buffer cache 20, each connected to bus 14. In a preferred form, internal cache 16 is a 4K byte, four-way set associative cache, pre-fetch cache 18 is a 128 byte, direct-mapped cache, and write buffer cache 20 is a 128 byte, two-way set associative cache.

A feature of the caches is that their functionality may be varied depending upon the host processor type (386, 386sx or 486) utilized. However, certain features of the caches do not vary. For example, internal cache 16 holds data which is selected solely on the basis of memory accesses by the host processor. In other words, internal cache 16 is dedicated to the host processor and will not be affected by memory accesses by other bus masters. It will be appreciated that each of the caches is readable by any of the bus masters. Thus, even though cache 16 will not allow data writes therein based on memory accesses by other than the system processor, it will be read by another bus master if requested data happens to reside therein. It will further be appreciated that each of the caches snoops (observes) any data writes not intended for it in order to invalidate its contents upon snoop hits, thereby ensuring coherency.

Another immutable feature of the caches is that pre-fetch cache 18 contains solely code data pre-fetched from DRAM 12. Furthermore, it only pre-fetches code based on a memory access by the host processor. In operation, whenever the system processor requests code data not already in the pre-fetch cache, the next sequential 128 bytes of code are pre-fetched into cache 18 as a queue in anticipation of subsequent requests for code.

Write buffer cache 20 only buffers data to be written into DRAM 12. It is not merely a write buffer, but is a cache which, as mentioned above, can be read by any bus master. However, it will not cache data from DRAM 12.

An important feature of the caches is the separation of the functionality of each of the caches and the selective definition of those functions based on the processor type. By this insight, the present system is able to achieve or exceed the performance of a system utilizing a cache many times larger than the cumulative size of the subject caches. With respect to the selective definition of function based on processor type, for a system employing a 486 system processor, write buffer cache 20 buffers data writes by any bus master other than the system processor. For a system employing a 386 or 386sx system processor, internal cache 16 holds only code data and is a read only cache for the system processor, and write buffer cache 20 buffers data writes by any bus master including the system processor. The operational characteristics of the caches are defined through self configuration at power-on time based on information relating to the type of host processor present.

DRAM controller 22 supports fast page mode for accesses to DRAM 12. Fast page mode is a well known technique for speeding up accesses to DRAM by activating a row line in a memory page and then strobing sequential column lines to transfer data into or out of DRAM. In the present invention, described more fully below, DRAM 12 is divided into pages which contain either code or non-code data. A register associated with DRAM 12 is located either in DRAM 12 or DRAM controller 22 and holds the page address of a most recently accessed page. In effect, the system provides a bias towards code pages or non-code pages depending upon the type of processor connected to the system. For example, if the system processor is a 486, the address of the most recently accessed code address page is held in the register. In operation, both code and non-code data pages in DRAM 12 can be randomly accessed. If a code page is accessed on one cycle and a non-code page is accessed on the next cycle, the address of the code page is held in a register while the non-code page is accessed. Immediately after the non-code page access, the address in the register is used to reopen the code page. In contrast, if the system processor is a 386 or 386sx, the address of the most recently accessed non-code address page is held in the register. The combination of selective open page bias, fast page mode accesses and multiple caches provides increased system performance.

Write buffer cache 20 is a two-way set associative cache. The non-code data region of memory may be divided into three areas known as list, heap and stack. Data blocks in memory are reserved for the list, heap and stack, each of which has its own organization and purpose. For example, a stack is a set of data elements, only one of which can be accessed at a time. The list data is primarily read and generally not written to. In structured programs, a high percentage of writes occur to the stack with the second most data writes occurring to the heap. By proper assignment of the heap and stack data blocks in DRAM and mapping respective blocks to opposing sets in the two-way set associative cache, increased operational efficiency can be realized. Furthermore, an open page bias in the DRAM for non-code data will effectively be an open page bias for list data. In this manner, operational efficiency of the subject invention is further enhanced.

Figure 2:
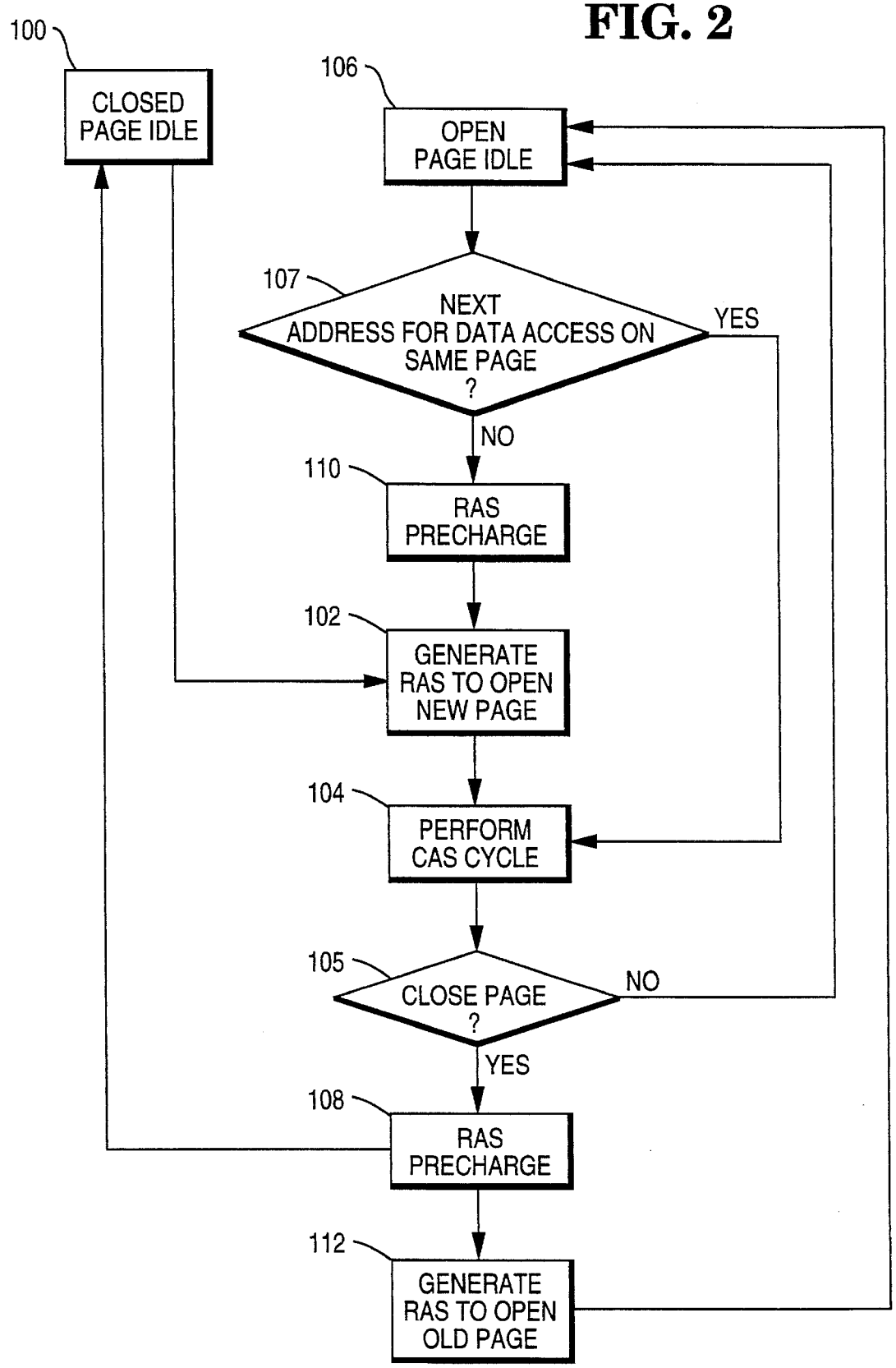
FIG. 2 is a flow diagram illustrating the operation of the present invention.

FIG. 2 is a flow diagram illustrating the operation of the present invention. At start up, and prior to any memory accesses, the memory system is at idle and all pages are closed (block 100). The memory system responds to the first address it receives by generating a memory access signal to open a memory page. The memory access signal includes a row address strobe (RAS) signal and a row address. The memory is accessed by following the RAS and row address with a column address strobe (CAS) signal and a column address. As is well known, row and column addresses are typically multiplexed over the same address line. In order to designate whether an address is for a row or column, the RAS or CAS control signal, respectively, is asserted when the address is provided. The RAS and CAS signals are typically active low signals so are deasserted or deactivated by precharging their respective signal lines high.

When the system is at closed page idle (block 100), the RAS and CAS lines are precharged high. When an address is received, the associated page is opened by generating a RAS signal and row address (block 102). Data is accessed in the open page by performing a CAS cycle (block 104). The CAS cycle involves the generation of a CAS signal and column address to access data (either read or write the data), and then removing or deasserting the CAS signal and column address. At this point, a decision is made (block 105) either to keep the page open by keeping RAS low or to close the page by precharging RAS high. The decision is based on the content of the page. In a preferred embodiment of the present invention, the content decision is based on whether the page in question includes code data or non-code data. In effect, the system has a preference or bias for keeping certain pages open to statistically improve the response time of the system memory. For example, for certain system configurations it may be desirable to have an open page bias for memory pages with code data (instructions). For other systems it may be desirable to have an open page bias for memory pages with non-code data. In a preferred form, the invention is based on an open page bias for either code data or non-code data. However, the invention is not limited to a division based on code or non-code, but can also be based on other identifiable differences in the data. For the remainder of the present description, it will be assumed that the system is based on an open page bias for code. However, this example is illustrative and should not be construed as limiting the claims.

Referring still to FIG. 2, after performing a CAS cycle (block 104) to access data on a page, the page will either remain open (block 106) by continuously asserting the RAS signal, or else the page will be closed and the RAS line deasserted by precharging it high (block 108). Assuming the system has an open page bias towards code pages, if the first page opened is a code page, the page will remain open after the first memory access (block 106). If the first page opened is a non-code data page, the page will be closed (block 108).

If the first page is a code page and the system is in the open page idle state (block 106), two possibilities exist (block 107). First, the next address could be for a data access on the same page. If so, since the RAS and row address are still active, only CAS and the column address need to be asserted (block 104) in order to access the desired data on the same page. The code page will again remain open (block 106). This sequence of deasserting the CAS signal and column address and reasserting CAS and a new column address can be repeated as long the next address provided is for the same page. Second, the next address could be for a data access on a different page. If so, the code page must be closed by precharging RAS (block 110). RAS is then reasserted with a new row address (block 102) and a CAS cycle performed (block 104) to access the desired data location in memory.

The preceding paragraph considered the possibilities if the first page is a code page. If the first page is a non-code page then after the CAS cycle (block 104), the page is closed by precharging RAS (block 108). Since there were no previous code pages opened, the system returns to the closed page idle state (block 100). As long as the subsequent accesses are only for non-code pages, the process will proceed as indicated by blocks 102, 104, 108 and 100.

The operation of the system for a first page containing either code data or non-code data should now be clear. Consider next the operation of the system after a code page has been opened (block 106) and an address signal for a new page has been received (block 110). The new page will itself be either a code or non-code page, and will be opened by generating a memory access signal in the form of RAS and row address (block 102). Data in the new page will be accessed by generating CAS and a column address (block 104). If the new page is a code page, then after the CAS cycle (block 104), the new page will remain open (block 106). However, if the new page is a non-code page, it will be closed (block 108). However, since the previous or old page was a code page, the previous page will be reopened (block 112) by regenerating or reasserting the memory access signal, RAS and row address. The system then returns to an open page idle state (block 106).

An important feature of the present invention is that a previously accessed memory page is automatically reopened prior to receiving the next memory address. This would provide no improvement if performed indiscriminately after every memory access. However, it is only performed for selected pages (old page—code, and new page—non-code, in the example). In many computer systems sequential memory accesses are made in the same page. If there are a large number of accesses to non-sequential locations, as might be caused by other than a single device, the memory can spend considerable time opening and closing data pages. By utilizing the open page bias of the present invention, the system will reopen selected pages in anticipation that the next memory access will be to such page.

Another feature of the present invention, not shown in FIG. 2, is that the full address or preferably the row address of the most recently accessed selected data type is stored when received. In the example, whenever an address for code data is received, its row address is stored in a register. The stored address is held while a subsequent non-code page is accessed. It is used after each such non-code access to reopen the most recently accessed code page (block 112).

As noted above, DRAM controller 22 supports fast page mode. When the Open page bias of the present invention is combined with a fast page mode operation, enhanced system performance may be realized.

The detail design of the present invention is captured in CDL, a high level hardware description language. CDL is a software tool which unambiguously defines the hardware for a digital logic system. The CDL listing completely defines a preferred embodiment of computer memory system 10. The listing may be compiled to generate a "C" source code which may then be compiled by a C compiler to generate a standardized C Object File Format (COFF). The COFF is then input to a logic synthesis program to provide a detailed logic schematic. A logic synthesis program which may be used for this purpose is SYNOPSYS, available from Synopsys Inc., Mountain View, Calif.

Figure 3:
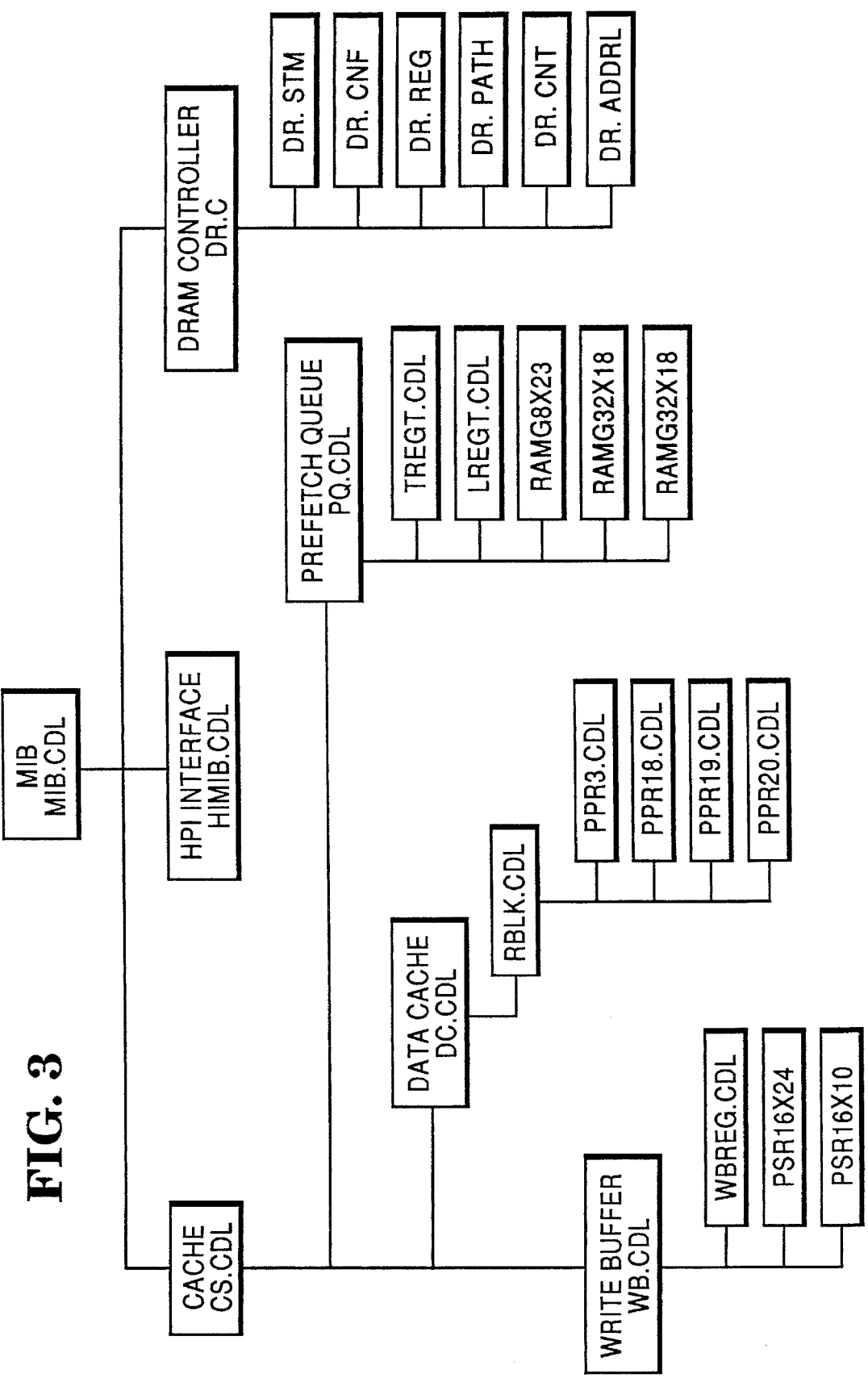
FIG. 3 is a block diagram showing the relationship between modules of the memory system.

FIG. 3 shows the relationship between the modules of the present invention. The structure and mode of operation of each of these modules is defined by the CDL listing, provided herewith as a microfiche appendix.

It will be clear to those skilled in the art that the present invention is not limited to the specific embodiment disclosed and illustrated herein. Numerous modifications, variations, and full and partial equivalents can be undertaken without departing from the invention as limited only by the spirit and scope of the appended claims.

What is desired to be secured by Letters Patent of the United States is as follows:

1. A method for accessing data in a random access memory divided into pages of a first and second type, said first and second types being based on identifiable differences in data stored in said pages, comprising the steps of:

opening a first page of said first type in said random access memory by generating a first memory access signal in response to a first address signal;

storing an address signal representing said first page;

opening a second page of said second type in said random access memory, after closing said first page, by generating a second memory access signal in response to a second address signal; and reopening said first page in said random access memory in response to said stored address signal prior to receiving another address signal.

2. The method of claim 1 wherein said first memory access signal includes a row address strobe signal and a first row address and said second memory access signal includes said row address strobe signal and a second row address.

3. The method of claim 2 wherein said storing step includes storing said first row address in a register prior to opening said second page.

4. The method of claim 3 wherein said first page is reopened by regenerating said first memory access signal in response to said stored first row address.

5. The method of claim 1 further comprising the step of:
accessing data in said first page when open by generating a column address strobe signal and at least one column address.

6. The method of claim 1 further comprising the step of:
accessing data in said second page when open by generating a column address strobe signal and a column address.

7. The method of claim 1 wherein said first page stores code data and said second page stores non-code data.

8. The method of claim 1 wherein said first page stores non-code data and said second page stores code data.

9. A method for accessing data in a random access memory divided into pages of a first and second type, said first and second types being based on identifiable differences in data stored in said pages, comprising the steps of:

opening a first page of said first type in said random access memory and accessing data therein in response to a first address signal;

storing an address signal representing said first page;

opening a second page of said second type in said random access memory, after closing said first page, and accessing data therein in response to a second address signal; and reopening said first page in said random access memory in response to said stored address signal prior to receiving another address signal.

10. A method for accessing data in a computer memory, said memory including a plurality of pages, each page being defined by a row address and a plurality of column addresses, comprising the steps of:

a. asserting a row address strobe (RAS) signal and a first row address in response to a first page address;

b. asserting a column address strobe (CAS) signal and a column address in response to said first page address to access data on said first page;

c. storing said first row address in a register;

d. asserting said RAS signal and a second row address in response to a second page address;

e. asserting said CAS signal and a second column address in response to said second page address to access data on said second page; and f. reasserting said RAS signal and said first row address in response to said stored first row address prior to receiving another address signal.

11. The method of claim 10 further comprising the step of:
continuously asserting said RAS signal and first row address, and deasserting said CAS signal and column address, after accessing data on said first page but prior to receiving said second page address.

12. The method of claim 11 further comprising the step of:
asserting another column address and reasserting said CAS signal, prior to receiving said second page address, in response to another first page address to access additional data on said first page.

13. The method of claim 12 further comprising:
repeating the steps of:
continuously asserting said RAS signal and first row address, and deasserting said CAS signal and column address, after accessing data on said first page but prior to receiving said second page address; and
asserting another column address and reasserting said CAS signal, prior to receiving said second page address, in response to another first page address to access additional data on said first page;
until receiving said second page address.

14. The method of claim 13 further comprising the step of:
deasserting said RAS signal and first row address upon receipt of said second page address and prior to step "c".

15. The method of claim 14 further comprising the step of:
deasserting said RAS and CAS signals and said second row and column addresses after accessing data on said second page.

16. A high performance computer memory system comprising:

a system memory divided into pages of a first and second type, said first and second types being based on identifiable differences in data stored in said pages;

means for opening a first page of said first type in said memory by generating a first memory access signal in response to a first address signal;

a register which stores an address signal representing said first page;

means for opening a second page of said second type in said memory, after closing said first page, by generating a second memory access signal in response to a second address signal; and means for reopening said first page in said random access memory in response to said stored address signal prior to receiving another address signal.

* * * * *